United States Patent [19]

Ho

[11] 4,210,885
[45] Jul. 1, 1980

[54] THIN FILM LOSSY LINE FOR PREVENTING REFLECTIONS IN MICROCIRCUIT CHIP PACKAGE INTERCONNECTIONS

[75] Inventor: Chung W. Ho, Mahopac, N.Y.

[73] Assignee: International Business Machines Corporation, Armonk, N.Y.

[21] Appl. No.: 920,914

[22] Filed: Jun. 30, 1978

[51] Int. Cl.² .............................................. H01P 3/08
[52] U.S. Cl. ................................... 333/238; 307/303; 333/172; 365/197
[58] Field of Search ............... 333/23, 81 A, 172, 238, 333/246, 247; 307/303, DIG. 1; 365/72, 197

[56] References Cited

U.S. PATENT DOCUMENTS

| 3,333,119 | 7/1967 | Anderson | 333/23 X |
| 3,466,634 | 9/1969 | Gamblin | 365/197 |
| 3,585,533 | 6/1971 | Denhard | 333/81 A X |
| 3,634,789 | 1/1972 | Stuckert | 333/81 A X |

Primary Examiner—Paul L. Gensler
Attorney, Agent, or Firm—Graham S. Jones, II

[57] ABSTRACT

Microcircuit chip packages mounted modules are connected together by lossy strip transmission lines parallel to a ground plane without termination. The transmission line segments are designed to have a total resistance $R_L$ which is within the range between two-thirds and two times the characteristic impedance $Z_o$ of the transmission line. Reflections are prevented from causing signal problems by maintaining $R_L$ above the minimum value. Similarly, the maximum value is intended to prevent deterioration of the wave shape.

8 Claims, 9 Drawing Figures

THIN FILM LOSSY LINE FOR PREVENTING REFLECTIONS IN MICROCIRCUIT CHIP PACKAGE INTERCONNECTIONS

DESCRIPTION

1. Technical Field

This invention relates to packaging for connecting high speed thin film chips electrically in an array with each other and external connections.

2. Background Art

Transmission of pulses in a high speed electronic circuit on transmission lines has usually been performed by using a low resistance line and a terminating resistor in order to prevent ringing of the pulse back and forth between the source and the load. The low resistance prevented attenuation and the resistor prevented ringing.

Doucet in "High Density Packaging of ECL Logic with Wire Wrap," Proceedings of the Technical Program, National Electronic Packaging and Production Conference, II, 166–167 points out that interconnection wiring delays or ringing can occur if the interconnection wiring is too long or if there is no termination resistor. Furthermore, long signal lines may have too much voltage drop due to series line resistance. The article suggested a design approach "toward a transmission line environment where signal path impedance is controlled." It is indicated that "long signal path . . . require attention to wiring impedance, but should be terminated with a resistive load equal to the characteristic impedance of the signal line." That prevents ringing of pulses. It was pointed out that series resistance and impedance of the bus cause poor voltage distribution and poor logic noise immunity. The article suggests solutions for terminating the bus. One is to have the load resistance equal the characteristic impedance of the transmission line. Another solution is to add the usual termination load resistor $R_L$ in FIG. 3, so that ringing is avoided where transmission lines are long. A third solution was to add a lump series resistor of 120–140 ohms in the line in series between the source and the load.

A number of problems have been found with a shunt load resistor for longer lines of the type shown in FIG. 3 of Doucet. Problems with this approach are that in more densely packaged computer systems using LSI chips, the heat produced by the shunt resistor cause as follows: (A) a substantial cooling burden for removing the heat caused by the shunt resistor, (B) a power supply burden for supplying the extra current to very large numbers of shunt resistors, (C) a space problem because shunt resistors require considerable space, and (D) a manufacturing problem because such resistors must be connected into the system by means of external wiring.

A series load resistor as shown in FIG. 4 of Doucet has disadvantages C and D above.

DESCLOSURE OF THE INVENTION

Figure 1:
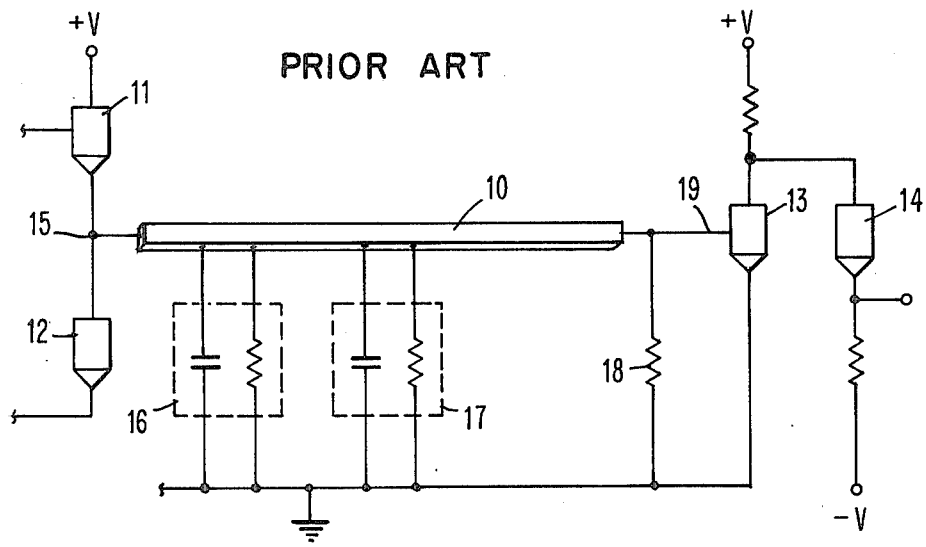
FIG. 1 shows a prior art thin film transmission line between parts of a circuit terminated in a terminating resistor.

FIG. 1 shows the conventional electrical circuit connection equivalent circuit employing a low impedance transmission line 10 (less than 1 ohm/cm) on a card (not shown) for mounting a number of transistor chips. To achieve low resistance, the line is 50–100 μm wide, which provides a low wiring density and is about two orders of magnitude less than the density on a chip. Transistors 11, 12, 13, and 14 on the chips (not shown) are arranged with transistors 11 and 12 having their emitter and collector, respectively, connected together on the Chip A (not shown) at point 15 which is connected by a chip-to-pad connection to transmission line 10 in the mounting card (not shown) in the usual way. A number of loads 16 and 17 are shown connected to line 10 each comprising, for example, a mixed resistive and capacitive load such as one would find with connections to other chips. At the end of the transmission line 10, a load resistor 18 and the base of transistor 13 are connected. The load resistor 18 is required for high speed circuits in order to reduce the effect of reflections of pulses back and forth between node 15 and node 19. The loss introduced by load resistor 18 causes the amplitude of the portion of the pulse reflected from node 19 to be attenuated sufficiently that ringing will be substantially obviated. That solution to the problem of ringing of pulses is satisfactory to some degree, in that it overcomes the reflection problem as desired. However, the resistor 18, being in shunt relationship with the base of transistor 13, draws a substantial amount of current continuously which requires considerable power which is used for the resistor. Resistors 18 require additional vias, pins, and space for the bulk of the resistors, which places an upper limit upon high wiring density in a circuit. A lump series resistor in series with the load as suggested by Doucet requires less current at the cost of requiring twice as many vias and terminals for connection to the circuit on the card, further limiting wiring density. For both the series and shunt lumped resistance terminations discussed above in connection with Doucet and FIG. 1, the lossless transmission lines require a line with a dimension of 50–75 μm in width for good conductors such as copper and silver. The wiring density in a given wiring plane of a multitiered structure of wiring is limited because of the large area required for such wide wiring. To satisfy the high wiring requirements for high speed LSI chips, by placing the LSI chips far apart horizontally to meet the wiring requirements increases the time delay involved as pulses are transmitted between chips. On the other hand, vertically stacked wiring planes increase power supply inductance for power to be delivered through the wiring planes.

Figure 2:
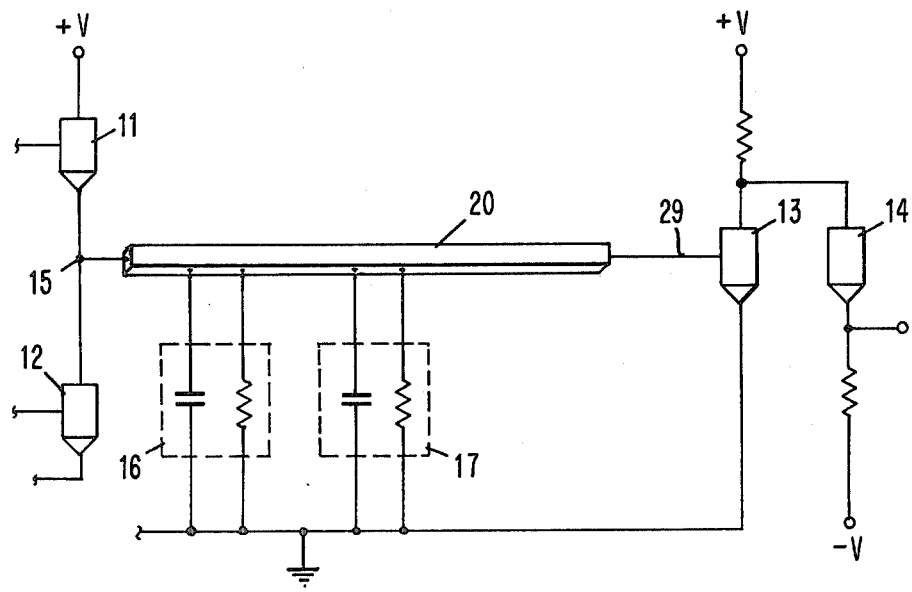
FIG. 2 shows the circuit of FIG. 1 redesigned in accordance with this invention, without the terminating resistor and with a new lossy transmission line in accordance with this invention.

FIG. 2 shows a circuit very similar to that of FIG. 1 which is modified in that the prior art conductor 10 of relatively large physical dimensions and the resistor 18 have been replaced in FIG. 2 by a lossy transmission line 20 of much smaller physical dimensions (not shown) which will prevent reflection of pulses with fast rise times, which permits high density by eliminating conventional bulky external resistors on the lower surface of the card. That reduces power consumption and reduces the number of vias and pins on a card all because of the elimination of the myriad external resistors required in the past for high speed LSI systems with fast rise time pulses. Because of the low inductance and capacitance of the line, there is minimal pulse distortion.

Figure 3:
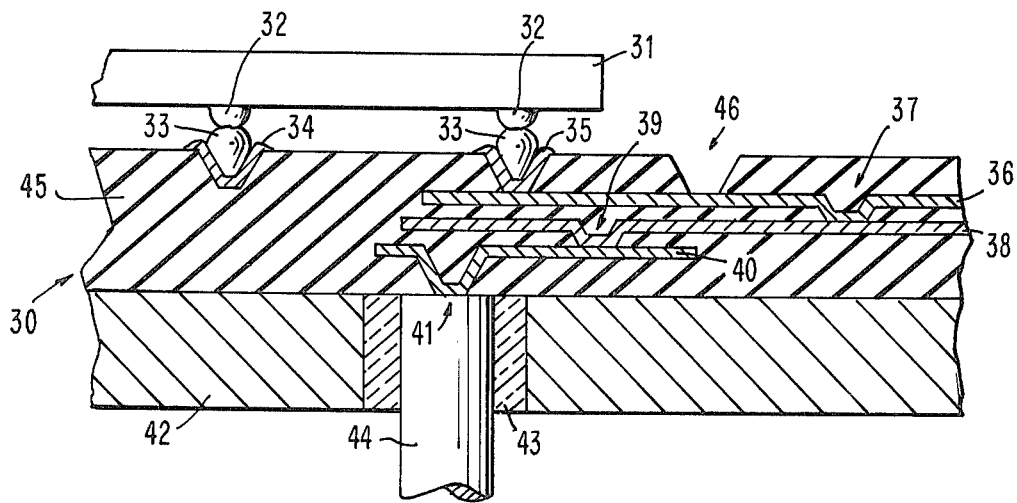
FIG. 3 shows a sectional view of a module including a plurality of lossy transmission lines in accordance with this invention located within the module, a connection pin and a fragment of an integrated circuit chip.
Figure 8:
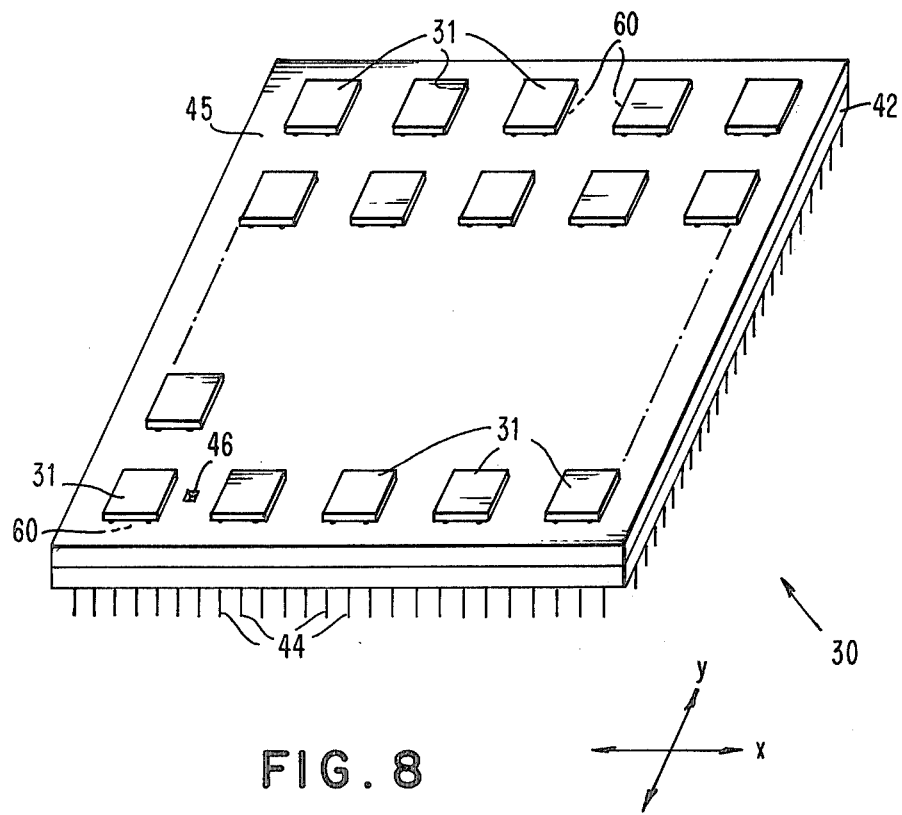
FIG. 8 shows a perspective view of an entire module with chips and pins in accordance with this invention.

FIG. 3 shows a design of an actual transmission line structure within a module 30 carrying a chip 31 having solder balls 32 connected to the solder balls 33 on vias 34 and 35 in module 30. Vias 34 and 35 are formed in conical depressions in the top surface of module 30 to connect by V-shaped conductors down to an upper lossy transmission line 36. Transmission line 36 extends through a via 37 beyond the right edge of the drawing to one or more other chip connected vias similar to vias 34. A transmission line 38 below line 36 is also connected to via 37. Lossy line 38 has been shown to be immediately beneath line 36 for convenience of illustration, but preferably line 38 actually would extend into the plane of the page, while below it, lossy line 40 connected by via 39 up to line 38 would preferably but not necessarily extend parallel to line 36 as shown. This arrangement would be suitable to an x, y rectilinear coordinate mapping system as shown in FIG. 8 with lines in the x direction on the level of line 38, lines in the y direction on the level of line 40, and the top level (including line 36) providing a testing and engineering change layer through opening 46 (only one of which is shown for convenience of illustration), where a laser can cut the connection, etc. in conventional fashion.

The lines 36, 38 and 40 are encapsulated within dielectric 45 composed preferably of polyimide, plastic or glass which insulates and supports them. The lowest line 40 is electrically connected by via 41 to a metal pin 44 which is adapted to plug into a connector. About pin 44 is a dielectric 43 composed preferably of glass. Beneath the other dielectric 45 is a metal plate 42 composed of a metal such as molybdenum or tungsten. Substrate 42 provides a physical support as well as an electrical ground plane for signals (as well as the ground for the power supply). The lines 36, 38 and 40 combined with ground plane 42 comprise individual lossy strip transmission lines which are designed to propagate high speed signal pulses while damping out reflections on the other hand.

Feedthrough pins 44, with flush pins at the upper surface of substrate 42, supply power with a minimum amount of package inductance to lines 36, 38 and 40, etc. and provide input and output signal paths for this package.

With this design it is possible to achieve higher wiring density since the lines 36, 38 and 40 can be very narrow and the thin film nature of the lines permits the power supply to be delivered through the metal substrate and lines to the chip with a minimum amount of added inductance.

The approach presented here uses thin film lossy lines for propagating high speed pulses without using any terminating resistors. If the resistance values of the thin film lines are chosen judiciously, not so small as to produce multiple reflections of a pulse on the line and not so large as to attenuate the pulse shape too severely, it can be shown that the delay of the pulse propagation on a lossy line is limited to less than 1.5 times the delay of the pulse propagation on a lossless line (connected to a terminating resistor) of the same length in the same dielectric medium. If the total resistance of the transmission line is defined to be $R_L$ and $Z_o$ is defined as the characteristic impedance of the transmission line, the range of values for $R_L$ for satisfactory transmission of pulses at high frequency is as follows:

$$\tfrac{1}{2} Z_o \leq R_L \leq 2 Z_o$$

As an example, for a thin film line if $R_o = 4.7$ ohms/cm (where $R_o$ is the characteristic resistance) and $Z_o = 40$ ohms, the line resistance has to be between 26.6 ohms and 80 ohms, which implies that the length of the line is constrained between $L_{max} = 16.9$ cm and $L_{min} = 5.64$ cm for the condition to be satisfied. Note that $L_{max} = 3 L_{min}$ with respect to the condition that the resistance of the line reaches its maximum value when the length of the line is $L_{max}$, that is the longest length that the thin film line can support for that value of $R_L$. On the other hand, for those lines required which are shorter than $L_{min}$, one may decrease the width of the lines to increase $R_L$ so that $L_{min}$ of the narrower line is reduced. Alternatively, for fixing the width of the line at a constant value, first consider the length of the line which is smaller than or equal to 0.9 $L_{min}$. The line is sufficiently short that one can wait for the leading edge of a pulse on the line to travel, say, 5 times back and forth at attenuated signal level as the signal is still rising to settle down because that is the same as the time required for the pulse to travel 1.5 times on the longest net $L_{max}$. For lines whose length is between 0.9 $L_{min}$ and $L_{min}$, one can lengthen those lines beyond what is necessary of the normal receiving end. For a typical thin film lossy line 36 in FIG. 4 of thickness t on dielectric 45 of thickness D deposited upon a ground plane of metal 42, the maximum and minimum allowable lengths are shown in Table I as a function of their widths.

The thin film lines have a dimension from a fraction of about 8 μm to 25 μm wide and a few micro-meters thick. They can be made using conventional photolithography techniques on a glass or polyimide medium used as the dielectric material. For a value of $L_{max}$ equal to 15 cm the substrate can be about 10 cm wide. With LSI bipolar chips containing 2-5 K circuits, the CPU of a big processor can be built with only a single level of packaging on the substrate with 2-3 layers of wiring. With no terminating resistors, the chip power due to off-chip drivers will be cut drastically because there is only transient power dissipation. The power dissipation in terminating resistors is completely eliminated. The performance of the machine will be much improved because its critical paths are reduced from meters in the conventional packaging scheme to centimeters in the new approach.

Figure 5:
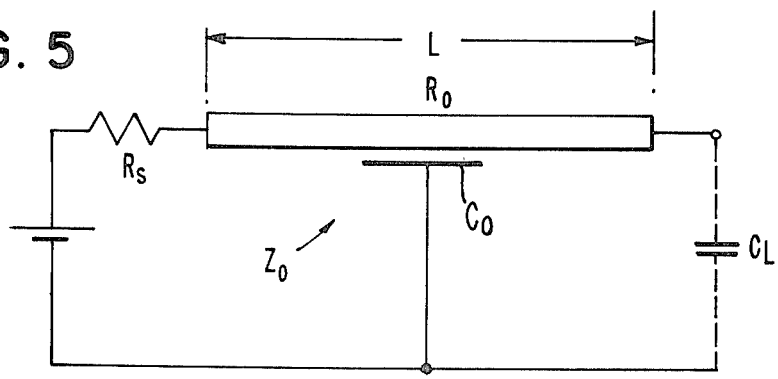
FIG. 5 shows a transmission line in accordance with this invention connected in an equivalent circuit.

An example of a thin film design is shown in Table I which is based on FIG. 5, where t=3 μm, D=6 μm, and ε=4. Also FIG. 5 shows the equivalent circuit values $R_s$ (source resistance), $R_o$, $C_o$, $Z_o$ (characteristic resistance, capacitance, and impedance), $C_L$ (load capacitance), and L when $L_{max}$ and $L_{min}$ are for maximum and minimum lengths L of the transmission line.

Table I

| Width (W/μm) | 8 | 12 | 16 | 20 | 24 |
|---|---|---|---|---|---|
| $C_o$ (pf/cm) | 1.41 | 1.68 | 1.89 | 2.24 | 2.40 |
| $Z_o$ (Ω) | 47 | 39 | 35 | 30 | 28 |
| $R_o$ (Ω/cm) | 6.65 | 4.45 | 3.35 | 2.68 | 2.24 |
| $R_s$ (Ω) | 7.5 | 5 | 3.74 | 3 | 2.5 |
| $I_{max}$ (ma) | 19 | 23 | 25 | 30 | 33 |
| $L_{max}$ (cm) | 14.0 | 17.6 | 21.2 | 22.3 | 24.9 |
| $L_{min}$ (cm) | 4.71 | 5.87 | 7.03 | 7.41 | 8.32 |

Figure 6:
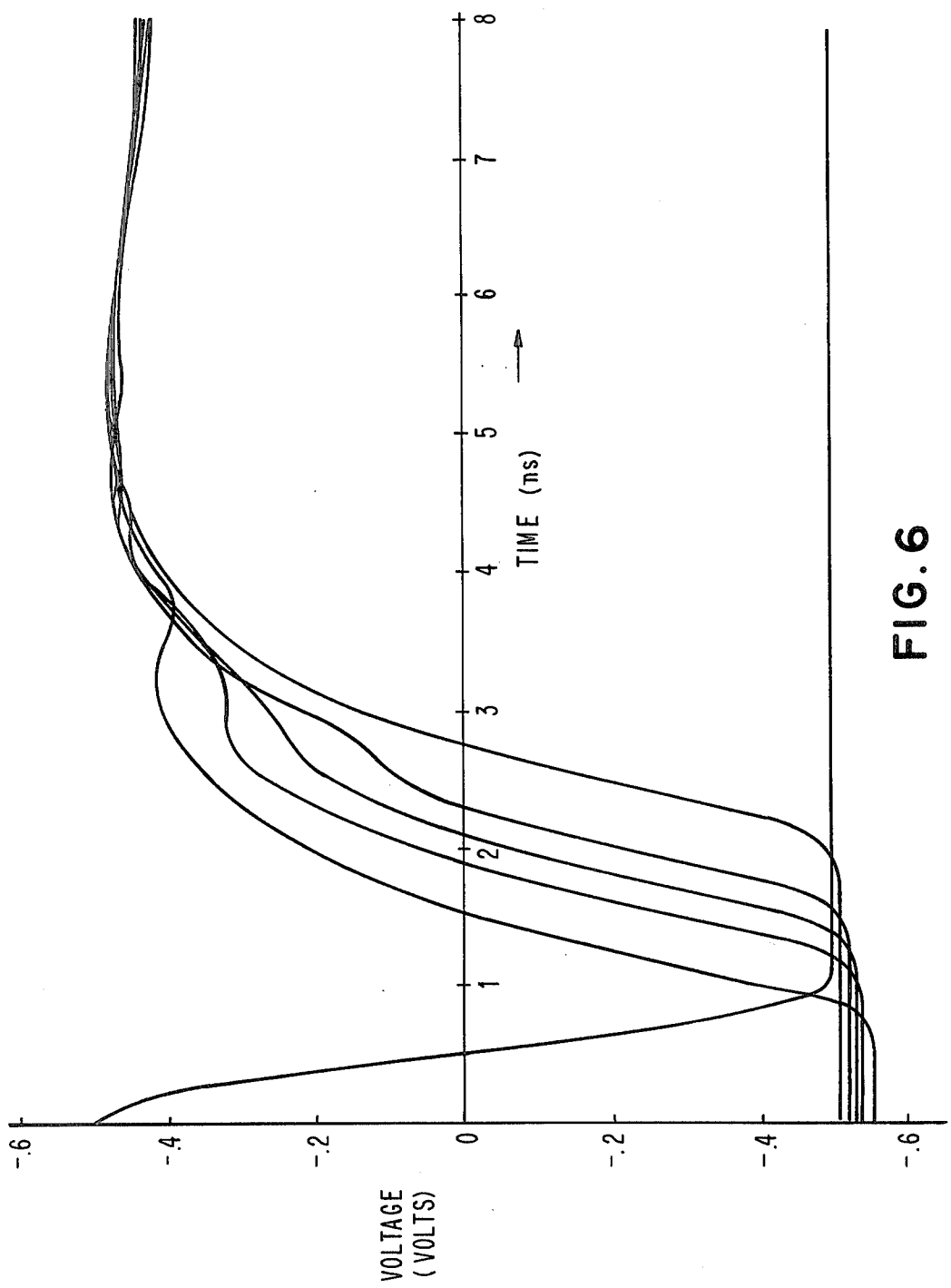
FIG. 6 shows an input voltage wave as a function of time for a typical bipolar chip driver circuit as in FIG. 1.
Figure 7:
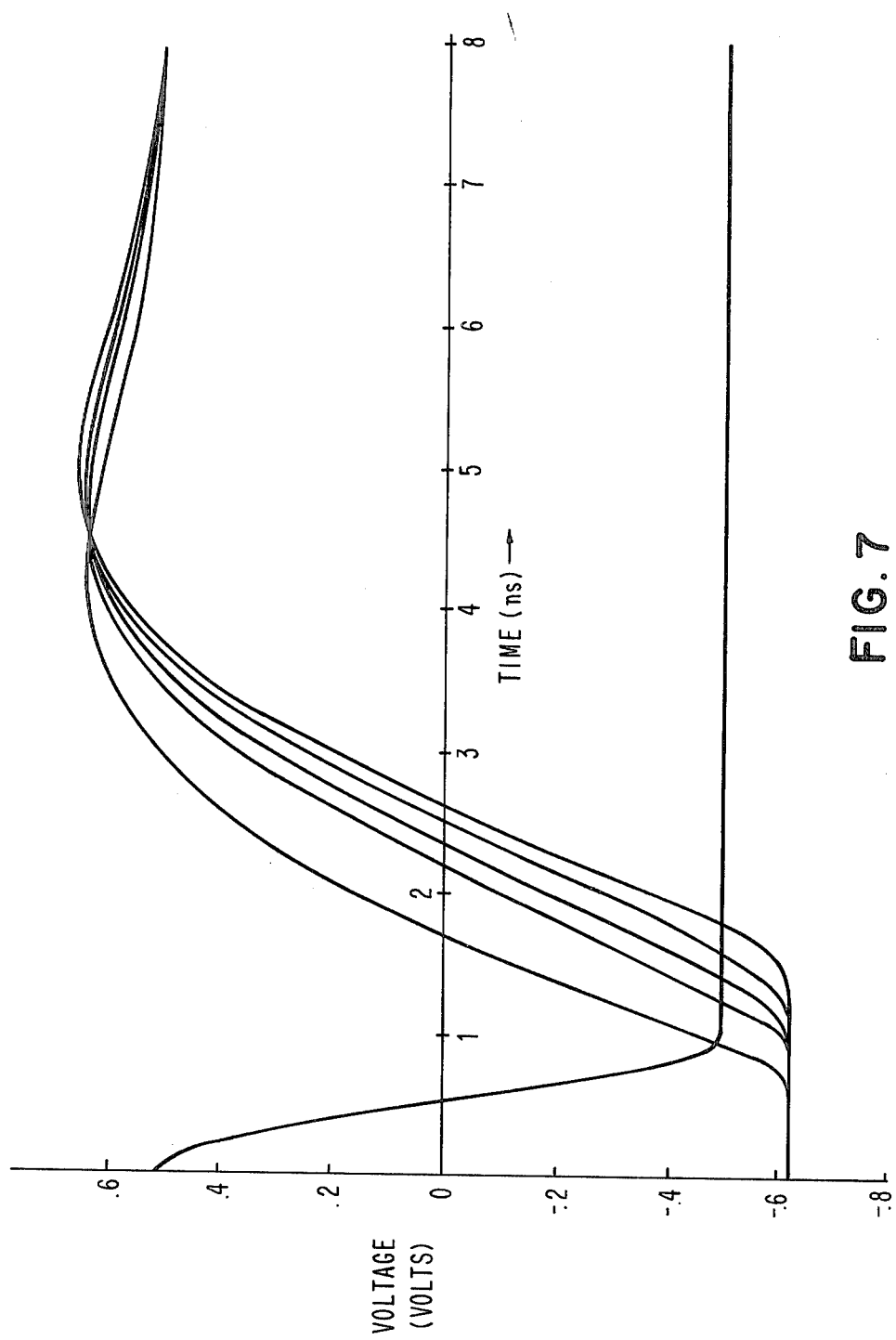
FIG. 7 shows an input voltage wave as a function of time for a typical bipolar chip where a lossy transmission line is employed and there is no resistor termination.

FIG. 6 shows the input voltage wave as a function of time when applied to a typical bipolar chip driver circuit and its output voltage wave propagating along the length of a lossless transmission line which is 11 cm long with a 50 ohm termination. On the other hand, FIG. 7 shows a similar wave for the same length of a lossy rather than lossless transmission line driven by the same bipolar driver circuit. Furthermore, there was no termination resistor. Although the voltage waves propagating on the lossy transmission lines are attenuated in amplitude, the voltage wave doubles itself when it reaches an open circuit to restore the lost magnitude.

Figure 4:
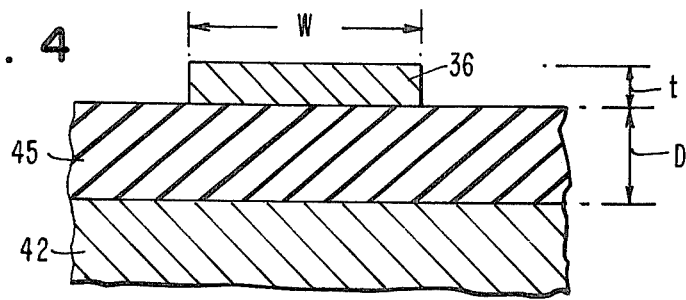
FIG. 4 shows a fragment of a thin film transmission line in cross-section with certain dimensions identified.

It should be noted that the lines 36, 38, 40, etc. and the ground plane 42 as shown in FIGS. 3 and 4 form thin film strip transmission lines. This is a batch fabricated pattern which is made by the well known thin film deposition techniques of photoresist photolithographic masking used in making LSI chips, vacuum deposition by such techniques as evaporation and sputtering, electroplating and the like which greatly facilitates the manufacture of modules.

The metallization and vias are built up in successive layers to form the structure of FIG. 3, one level at a time in the batch fabricated mode. Thus, the metallization line 40 in the x direction is deposited upon a layer of dielectric 45 through which a via hole has been opened by a batch processing step. Next, the metallization 40 is covered with more dielectric 45 and then metallization 38 is deposited extending in the y direction and so forth.

Figure 9:
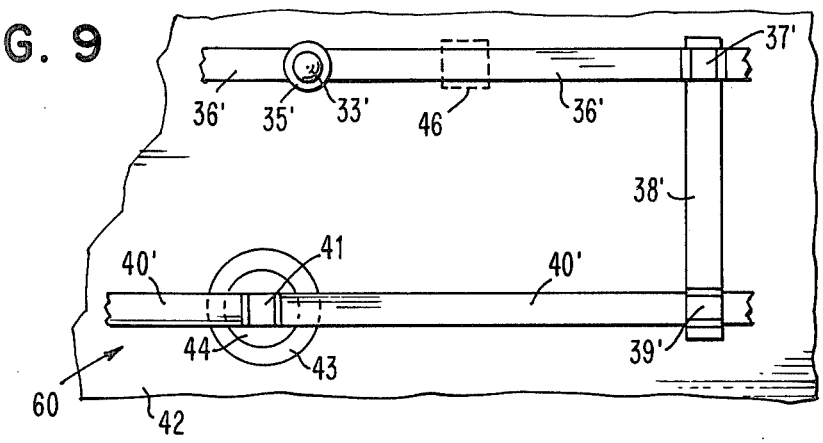
FIG. 9 shows a plan view of the transmission lines of FIG. 3 as modified to provide a realistic form of connection between a solder connection and a pin.

FIG. 9 shows the area 60 of FIG. 8 in a module with transmission line 36' analogous to line 36 connected to metallization 33' and 35' at the solder joint to a chip (not shown). Line 36' and another line 40' on a lower level extend in the x direction. At an intermediate level line 38' directed in the y direction couples the lines 36' and 40' through vias 37' and 39'. Line 40' connects to a pin 44 surrounded by dielectric 43 in ground plane 42 by via 41'. An access opening in dielectric 46' is shown in phantom. It is believed that this clarifies the true rectilinear (orthogonal x, y) relationship of the lossy transmission lines which are buried in the dielectric 45 in FIG. 3 to permit making many connections between pins, solder balls, and transmission lines.

Industrial Applicability

Lossy transmission lines of this type are applicable for thin film large scale integrated circuit devices with high speed signals, particularly where compactness of design and minimization of power dissipation are of importance.

Having thus described my invention, what I claim as new, and desire to secure by Letters Patent is:

1. In an integrated circuit package carrying a plurality of integrated circuit chips having an electrical ground plane and a plurality of conductors with at least one conductor connecting electrically from one circuit node to another, each of said chips having a plurality of electrical terminals connected to some of said nodes, the improvement comprising a total resistance value in each of said conductors that is greater than ⅔ but less than 2 times the characteristic impedance of said conductors, and said conductors and ground plane forming lossy strip transmission lines, whereby significant attenuation of reflected signals is provided between chips.

2. In an integrated circuit package in accordance with claim 1, said conductors being contained within a module having a ground plane layer with a layer of dielectric thereon in which said conductors are supported.

3. In an integrated circuit package having at least one conductor from one circuit node to another, the improvement comprising a total resistance value in said conductor that is greater than ⅔ but less than 2 times the characteristic impedance of said conductor,
said conductor being contained within a module having a ground plane layer with a layer of dielectric thereon in which said conductor is supported, and said conductor and said ground plane comprising a strip transmission line,
said ground plane including an opening therein, with a dielectric and a connector pin secured therein, with said line being electrically connected to said pin, whereby said pin has minimal inductive coupling to said line and any other lines in said dielectric.

4. An integrated circuit package having at least one conductor from one circuit node to another, the improvement comprising a total resistance value in said conductor that is greater than ⅔ but less than 2 times the characteristic impedance of said conductor,
said conductor being contained within a module having a ground plane layer with a layer of dielectric thereon in which said conductor is supported, and said conductor and said ground plane comprising a strip transmission line,
a plurality of sets of said conductors are included within said dielectric in a rectilinear (x, y) coordinate system with the conductors at a given depth within said dielectric generally extending parallel with one another.

5. A package in accordance with claim 2 wherein said dielectric and said conductors are fabricated by a processing technique involving photolithography.

6. A package in accordance with claim 2, wherein said ground plane includes an opening therein, with a dielectric and a connector pin secured therein, with one of said conductors in a said line being electrically connected to said pin, whereby said pin has minimal inductive coupling to said conductor of said line and any other conductors forming strip transmission lines in said dielectric.

7. A package in accordance with claim 2, wherein a plurality of sets of conductors are included within said dielectric in a rectilinear (x, y) coordinate system with the conductors at a given depth within said dielectric generally extending parallel with one another.

8. A package for interconnection and mounting of a plurality of microcircuit chips comprising:
a plurality of said chips,
a body of dielectric material juxtaposed with a conductive ground plane in contact therewith,
a plurality of electrically conductive elements having an electrical resistance $R_L$ greater than ⅔ but less than 2 times the value of the characteristic impedance $Z_o$ of the transmission line formed by the combination of said elements, said dielectric, and said ground plane, each of said chips having a plurality of connection terminals, several of said terminals from said chips being connected to one of said conductive elements and providing electrical interconnections between some of said terminals of said chips for providing interconnections of electrical potentials between said chips with significant attenuation of reflected signals.

* * * * *

UNITED STATES PATENT AND TRADEMARK OFFICE
CERTIFICATE OF CORRECTION

PATENT NO. : 4,210,885
DATED : July 1, 1980
INVENTOR(S) : Chung W. Ho

It is certified that error appears in the above-identified patent and that said Letters Patent are hereby corrected as shown below:

Column 4, line 17, $1/3Z_o$ should be $2/3Z_o$

Signed and Sealed this

Sixth Day of January 1981

[SEAL]

Attest:

SIDNEY A. DIAMOND

Attesting Officer

Commissioner of Patents and Trademarks